(12) United States Patent
Kondo et al.

(10) Patent No.: US 6,995,031 B2
(45) Date of Patent: Feb. 7, 2006

(54) ELECTRODE SUBSTRATE OF PLASMA DISPLAY PANEL AND METHOD FOR MAKING THE SAME

(75) Inventors: Yasuhiko Kondo, Kobe (JP); Makoto Sugiya, Kobe (JP)

(73) Assignee: Sumitomo Rubber Industries, Ltd., Hyogo (JP)

( * ) Notice: Subject to any disclaimer, the term of this patent is extended or adjusted under 35 U.S.C. 154(b) by 0 days.

(21) Appl. No.: 10/931,519

(22) Filed: Aug. 31, 2004

(65) Prior Publication Data

US 2005/0023527 A1   Feb. 3, 2005

Related U.S. Application Data

(62) Division of application No. 10/040,838, filed on Jan. 4, 2002, now Pat. No. 6,853,001.

(30) Foreign Application Priority Data

| Jan. 9, 2001 | (JP) | ................................. 2001-1609 |
| Feb. 15, 2001 | (JP) | ................................. 2001-38991 |

(51) Int. Cl.
*H01L 21/00*   (2006.01)

(52) U.S. Cl. ...................................................... 438/30
(58) Field of Classification Search ................... 438/30
See application file for complete search history.

(56) References Cited

U.S. PATENT DOCUMENTS

2004/0037953 A1 * 2/2004 Masuda et al. ............. 427/162

FOREIGN PATENT DOCUMENTS

JP   11-342680   12/1999

* cited by examiner

*Primary Examiner*—Thao P. Le
(74) *Attorney, Agent, or Firm*—J.C. Patents (57) ABSTRACT

An electrode substrate of a PDP has an electrode pattern on a glass substrate and is made by baking and removing a resin binder in a conductive pattern composed of a conductive ink. The conductive pattern is formed by printing the conductive ink on the glass substrate by an intaglio offset printing method. The conductive ink is formed by dispersing or dissolving a metal powder and a resin binder into a solvent. A printing blanket used for printing the conductive pattern has a rubber layer on the surface of the printing blanket, and the rubber layer poses a volume increasing rate under 20% when the rubber is immersed in the solvent for 24 hours at 23° C. The printing blanket is heated such that a surface temperature $T_B$ of the printing blanket is about 40~200° C., and then the printing blanket is cooled in a condition that the surface temperature $T_B$ (° C.) of the printing blanket with respect to a surface temperature $T_P$ (° C.) of the intaglio satisfies the equation $|T_P-T_B| \leq 5°$ C. As a result, the electrode substrate has a tiny and highly precise electrode pattern.

5 Claims, 1 Drawing Sheet

ELECTRODE SUBSTRATE OF PLASMA DISPLAY PANEL AND METHOD FOR MAKING THE SAME

CROSS-REFERENCE TO RELATED APPLICATION

This application is a divisional application of, and claims the priority benefit of, U.S. application Ser. No. 10/040,838 filed on Jan. 4, 2002 now U.S. Pat. No. 6,853,001.

BACKGROUND OF THE INVENTION

1. Field of the Invention

This invention relates in general to an electrode substrate of a plasma display panel (PDP) having a tiny and high-precision electrode pattern. More specifically, the invention relates to a manufacturing method for an electrode substrate of a plasma display panel (PDP) that is capable of precisely and inexpensively making the electrode pattern.

2. Description of Related Art

Conventionally, the brown tube (cathode ray tube, CRT) or liquid crystal display (LCD) is widely used in display device, such as color television or personal computer. However, there are certain limitations on miniaturization and rarefaction due to their structures.

On the other hand, plasma display panel (PDP) is recently noted for replacing the foregoing displays. The PDP can be used for providing a very thin display device because the pixels are self-emitting type. Furthermore, in comparison with the LCD, the PDP structure is simpler and thinner, and therefore it is easily to achieve a large screen. Accordingly, the huge demand for PDP as the next generation display is anticipated. However, the manufacturing cost for a PDP is very high at present, which is a barrier to commercialize the home-oriented display device.

Figure 1:
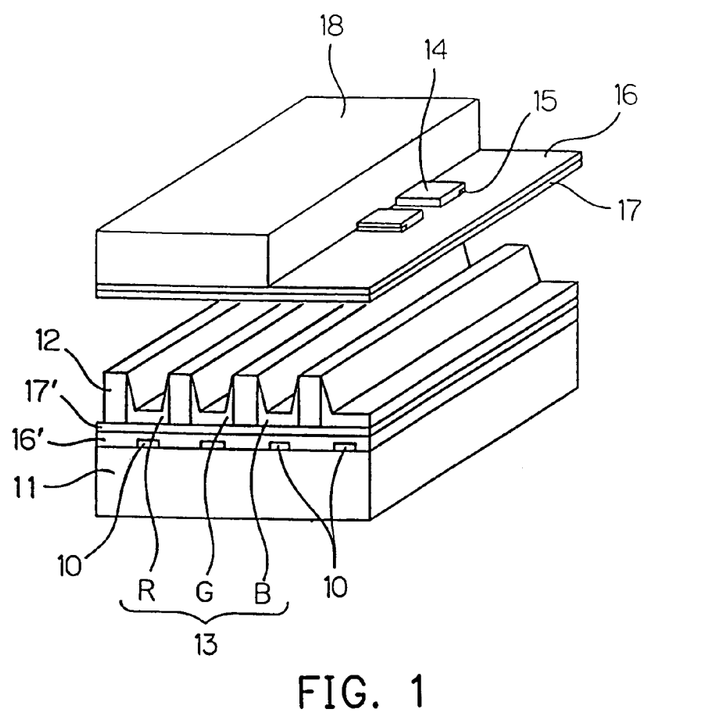
FIG. 1 shows an exemplary perspective view of a back substrate of a plasma display panel (PDP)

FIG. 1 shows an exemplary perspective view of a rear substrate of a plasma display panel. As shown, the PDP is composed of a rear substrate having an address electrode (Ag) 10, a dielectric layer (glass) 16' and a passivation layer (MgO) 17', and is combined face-to-face with a front substrate 18 that has a transparent electrode 14, a bus electrode 15, a transparent dielectric layer 16 and a passivation layer (MgO) 17. The rear electrode 10, ribs (spacers) 12 and fluorescent layers (R, G and B) 13 are formed on the rear electrode 10.

Conventionally, the electrodes are formed by coating the silver paste (for example, "fodel®" registered by Dupont) with a predetermined thickness (5–10 $\mu$m) on the whole rear substrate, and then the silver paste is patterned by drying, exposure and development. The electrodes are also formed by adhering a photosensitive silver tape on the front substrate and then patterned by exposure and development. Namely, the electrode pattern is formed by the photolithographic method.

However, when the line width of the pattern complies with the requirement of the electrode, the line width is 50–70 $\mu$m and the corresponding pitch is about 350 $\mu$m. The amount of the removed silver paste in the developing process would be too much and would not be economical. The removed silver paste must be recycled and reused because low utilization rate of the silver paste and high manufacturing cost of the electrode are highly related. However, there are no effective methods for solving the cost issues in the recycle and reuse processes.

Additionally, in order to increase the opening rate at the front substrate, forming an electrode pattern that has a width thinner than 2~50 $\mu$m is required. Furthermore, from the aspect of suppressing the light reflection, not only the pattern composed of silver, but the silver pattern containing black color has to be provided at the same time. Therefore, it becomes more obvious that the paste utility rate is low and the manufacturing cost increases.

The apparatuses used in the series of processes of exposure, development and drying of photolithography require very high precision and cleanliness. Moreover, because a large amount of harmful liquid waste is generated, burdens to the environment and the processing of the liquid waste become large. Therefore, the manufacturing of electrode by photolithography is very disadvantageous in the aspect of cost.

In order to solve the issues above, the inventor repeatedly studies and discusses the use of the printing method for replacing the photolithographic method such that the electrode pattern of a PDP panel can be inexpensively formed.

Conventionally, the printing method is not suitable for forming a very tiny and highly precise pattern for the PDP electrode. In addition, among the various printing methods, even though the intaglio offset printing method that is the most superior in printing accuracy is used, it still has a drawback (pinhole) that the printing shape deteriorates due to the repeated printing. Also, from the point of view of productivity, it is very difficult to use the printing method for making the electrode substrate for a PDP panel.

However, the inventor repeatedly studies and finds that the electrode pattern can be made by printing with a conductive ink containing metal powder to form a conductive pattern, and then baking the conductive pattern to form the electrode pattern.

As a result, even though it is conventionally very difficult to form a tiny pattern with a highly precise printing method, a completely unexpected new fact is discovered that a very tiny and highly precise electrode pattern, meeting the requirements of a PDP panel, can be made by the printing method when the intaglio offset printing is used as the printing method, wherein the solvent of the conductive ink and the rubber material used as the surface layer of the printing blanket are suitably combined to meet the swelling degree relative to the solvent of the rubber.

In addition, to form an electrode pattern of a PDP panel using the printing method is a result of repeatedly diligent study. Even though the printing method is used for forming a conductive pattern, a very tiny and highly precise electrode pattern can be formed. To form a very tiny and highly precise electrode pattern that meets the requirements for the manufacturing of an electrode substrate of a PDP panel, the intaglio offset printing method is used and the printing blanket used for transferring the conductive ink is heated after one or several times of printings are finished under a predetermined condition to vaporize the solvent of the ink that is immersed into the surface of the printing blanket. Furthermore, an increase in the productivity and an inexpensive manufacturing of the electrode substrate of the PDP panel are achieved.

SUMMARY OF THE INVENTION

The invention provides an electrode substrate of a plasma display panel, having an electrode pattern on a glass substrate. The electrode pattern is made by baking and removing a resin binder component of a conductive pattern composed of a conductive ink. The conductive pattern composed of the conductive ink is formed by printing with the conductive ink on the glass substrate by an intaglio offset printing method. The conductive ink is formed by dispersing or dissolving a metal powder and a resin binder into a solvent. A printing blanket used for printing the conductive pattern has a rubber layer on the surface of the printing blanket, and the rubber layer poses a volume increasing rate under 20% when the rubber is immersed in the solvent of the conductive ink for 24 hours at 23° C.

The PDP substrate of the invention has a very tiny and highly precise electrode pattern required by a PDP electrode. In addition, because the pattern is made by the printing method, it is very low in price in comparison with that of the conventional PDP substrate.

As for the PDP substrate of the invention, from the aspect of the printing accuracy and better accuracy of the electrode pattern, it is preferable that the printing blanket used for forming the conductive pattern by the intaglio offset printing has a surface rubber layer having a hardness (JIS A) of 20~80°, and a ten-point mean roughness (Rz) of 0.01~3.0 μm.

The invention further provides a method for manufacturing an electrode substrate of a plasma display panel. A conductive ink fills into cavities of an intaglio, wherein conductive ink is formed by dispersing or dissolving a metal powder and a resin binder into a solvent. Afterwards, the conductive ink is transferred from the cavities of the intaglio onto a printing blanket, wherein the printing blanket has a rubber layer as a surface layer of the printing blanket, and the rubber layer poses a volume increasing rate under 20% when the rubber is immersed in the solvent of the conductive ink composition for 24 hours at 23° C. Next, the conductive ink composition is transcribed from the surface layer of the printing blanket onto a glass substrate. A conductive pattern composed of the conductive ink composition formed on the surface of the glass substrate is baked to remove a resin binder component of the conductive pattern.

According to the method for manufacturing the electrode substrate of the PDP panel of the invention, the electrode material is not wasted using the photolithographic method because the electrode pattern is formed by printing the conductive ink composition. Therefore, the manufacturing cost can be reduced significantly.

In addition, there is no effluent liquid waste because for example, the developing process is not required. Therefore, it is not necessary to consider the cost required for the influence on the environment and the processing of the liquid waste.

The intaglio offset printing method is fully advantageous from the aspect of lowering the manufacturing cost because the structure of the required apparatus is simpler in comparison with that used in photolithography.

According to the method of the invention, even though it is conventionally very difficult to form a tiny and a highly precise pattern that is required by the PDP electrode by the printing method, a very tiny and highly precise electrode pattern meeting the requirements of the PDP panel can be made by suitably combining the printing blanket used for printing and the solvent of the conductive ink.

As for the PDP substrate of the invention, from the aspect of a printing accuracy and a better accuracy of the electrode pattern, it is preferable that the printing blanket used for forming the conductive pattern by the intaglio offset printing has a surface rubber layer having a hardness (JIS A) of 20~70°, and a ten-point mean roughness (Rz) of less than 1 μm.

The invention further provides a method for manufacturing an electrode substrate of a plasma display panel. A conductive ink fills into cavities of an intaglio, wherein the conductive ink is formed by dispersing or dissolving a metal powder and a resin binder into a solvent. Afterwards, the following processes (i) and (ii) are performed in sequence: (i) transferring the conductive ink from the cavities of the intaglio to the surface of the printing blanket; and (ii) transferring the conductive ink from the surface of the printing blanket to the surface of a glass substrate. Next, a conductive pattern composed of the conductive ink formed on the surface of the glass substrate is baked to remove a resin binder component of the conductive pattern.

After the processes (i) and (ii) are performed in sequence for one, two or more times, the printing blanket is heated such that a surface temperature TB of the printing blanket is about 40~200° C., and then the printing blanket is cooled in a condition that the surface temperature TB (° C.) of the printing blanket with respect to a surface temperature TP (° C.) of the intaglio satisfies following equation (1).

$$|TP-TB| \leq 5° C. \quad (1)$$

The method for manufacturing the electrode substrate of the PDP panel has the following advantages.

(I) The photolithographic method is not used for forming the electrode pattern. By using the printing method, the manufacturing cost can be reduced significantly and the burden of processing the liquid waste can be reduced.

(II) A tiny pattern required by the electrode substrate of the PDP panel can be precisely formed by using an intaglio offset printing method and performing a heating process at a predetermined temperature to the printing blanket.

(III) By the heating process above, the degradation of the printing shape and pinholes when the printing blanket swells can be prevented from occurring. A high manufacturing productivity of the electrode substrate of the PDP panel can be achieved.

(IV) Because the printing blanket is cooled after the heating process such that the surface temperature of the printing blanket with respect to the surface temperature of the intaglio is not higher than a predetermined range, the intaglio is prevented from expanding due to the heat remaining at the printing blanket, the printing shape from degrading and the pinholes from occurring.

Therefore, the method for manufacturing the electrode substrate of the PDP panel is very useful and advantageous.

In addition, conventionally, there are methods for returning the printing blanket that is swelled by the ink solvent from its original status. First, the printing blanket is immersed in a liquid that is miscible with the ink solvent for a predetermined time for extracting the ink solvent. The liquid that is miscible with the ink solvent is then vaporized from the printing blanket. In addition, another method is that the printing blanket is illuminated by microwave, and then the ink solvent is heated to volatilize (referring to claim 1 and embodiment 3 in Japanese Laid Open 9-254365). However, the first method is performed by taking the printing blanket out of the printing roll (the printing body), and the later method is also performed by taking the printing blanket out of the offset printing machine. Therefore, there are problems that the operational time stops and the productivity reduces drastically.

In addition, according to Japanese Laid Open 2000-158633 and 2000-158620, methods for removing the ink solvent from the printing blanket are disclosed, wherein the methods utilize absorber such as the rubber forming the surface printing layer of the printing blanket (or similar rubber), hygroscopic unwoven fabric or paper in direct contact with the printing blanket. However, the ink solvent cannot be sufficiently removed only by contacting with the absorber. In contrast, there is a problem that dust from the absorber may adhere on the surface of the printing blanket.

According to the method disclosed in Japanese Laid Open 8-34176, the internal of the blanket body is a vacuum and the ink solvent immersed in the printing blanket is absorbed and removed from the internal of the blanket body. In the Japanese Laid Open 2000-135852, a roller member having porous member with continuous bubble is in contact with the surface of the printing blanket and the ink solvent is removed from the surface of the printing blanket by vacuum absorption. However, any one of the methods disclosed above requires the complicated apparatus (blanket body and roller member) and the removing effect of the ink solvent is not adequate.

According to the method for manufacturing the electrode substrate of the PDP panel above, the surface printing layer of the printing blanket is composed of a silicon rubber, and has a hardness (JIS A) of 20~80°, a ten-point mean roughness (Rz) of 0.01~3.0 $\mu$m and a thickness of 1~1500 $\mu$m. The printing accuracy of the pattern composed of the conductive ink can be higher.

BRIEF DESCRIPTION OF THE DRAWINGS

While the specification concludes with claims particularly pointing out and distinctly claiming the subject matter which is regarded as the invention, the objects and features of the invention and further objects, features and advantages thereof will be better understood from the following description taken in connection with the accompanying drawings in which:

DESCRIPTION OF THE PREFERRED EMBODIMENT

Followings are detailed descriptions of a manufacturing process for making an electrode of the plasma display panel (PDP) and a PDP substrate.

Printing Method for a Conductive Pattern

Conventionally, the photolithographic process used for forming an electrode pattern is a very excellent method in forming a resoluble and precise pattern. However, the development of PDP is heading toward the direction of a large scale display device, for example, over 40 inches. As the display device becomes larger and larger, the exposure device and developing etching device in a photolithographic process must become large as well, thereby the enlargement of the related devices is very disadvantageous in the consideration of cost. In addition, because the running cost of the devices is very high, it is very difficult to reduce the required cost to half of that of the current PDP manufacturing process.

Therefore, the invention utilizes the printing method, which is capable of enlarging display elements and forming patterns.

There are many printing methods, of which a screen printing cannot truly reproduce the patterns with a line width less than 100 $\mu$m. There are also problems that broken lines always occurring. Additionally, in principle, because the forces applied at the central and peripheral portions of the screen are different, which then cause different extensions, the printing accuracy of the patterns on the same rear substrate are different. Therefore, the screen printing cannot satisfy the printing accuracy (surface accuracy ±10 $\mu$m) required by the electrode.

An offset printing is also well known in addition to the screen printing. However, there is a problem that the layer thickness obtained by a planographic offset printing, one of the offset printing methods, cannot be over 0.5 $\mu$m each time. The layer thickness is reduced due to the subsequent baking process. Considering that the thickness of the conductive pattern formed by printing has to be several $\mu$m, the planographic offset printing must be repeatedly performed from several times to ten times. As a result, the productivity and the printing accuracy reduce significantly. The manufacturing cost also increases.

Recently, on the other hand, an improvement of the planographic offset printing method, the waterless planographic printing using a silicon rubber on the non-pattern portion of the transcriber (for example, "TAN" made by Toray Industries), is widely used. However, the waterless planographic printing is the same as the planographic printing, in which the layer thickness cannot be over 0.5 $\mu$m each time. As a result, due to the repeated printing, there are problems that the productivity and the printing accuracy reduce, leading to an increase of the manufacturing cost.

In addition, because the thickness of the ink layer obtained by a relief offset printing each time is also thin, the same problems as described above are resulted. Because of the ink effusion, also known as marginal zone, generated around the pattern in the relief printing, it is very difficult to truly reproduce the pattern.

Contrary to the relief printing, the intaglio offset printing is capable of freely controlling the pattern thickness by changing the depth of the cavities formed on the intaglio. Because a silicon rubber is used to cover the surface of the printing blanket, the ink transferred from the intaglio to the printing blanket can be hundred-percent transcribed. Therefore, the pattern with a very thin thickness can be formed by intaglio offset printing for each printing. Additionally, because the ink dividing is only one time when transferring from the intaglio to the printing blanket, the shape of the printed pattern is excellent and the pattern can have a very thin line width of about 20 $\mu$m. Therefore, a highly accurate pattern can be reproduced. Because the intaglio with a very good shape can be formed by etching the metal or the glass using the photolithographic method, it is possible to print a very tiny and highly precise pattern by using the printing blanket that has a smooth surface and a good ink-transferability. In particular, the intaglio offset printing that uses a printing blanket having a surface composed of silicon rubber is very suitable for printing the electrode pattern of PDP.

Assuming that the total cost is one that comprising the cost for forming the conductive pattern by the intaglio offset printing and the cost for forming the electrode pattern by the subsequent baking process, the required cost for forming the electrode pattern by the offset printing is 3~10 in general. Therefore, it is possible to form a very thin and highly accurate pattern at a very low cost.

Intaglio

The intaglio, used as an original plate (master) when the conductive pattern is formed by printing, has cavities corresponding to the electrode patterns to be formed on the surface of the intaglio. The intaglio can be a plate shape, a plate shape rolled on a cylinder, a cylindrical shape and a pillar shape etc., for example.

The surface smoothness of the foregoing intaglio is very important. If the surface of the intaglio is not smooth, ink residues may occur at some places on the intaglio surface (outside the cavities) when the conductive ink is filled in the cavities by a doctor blade. The ink residues contaminate the non-pattern portion and reduce the printing accuracy. Therefore, an intaglio is required to have an excellent surface smoothness to perform a pattern printing with a very high accuracy.

In regard to the smoothness (surface roughness) of the surface of the intaglio, which is characterized by ten point average roughness (Rz), Rz is better to be under 1 µm and is preferably under 0.5 µm.

The substrate of the intaglio can be a glass substrate, such as, soda lime glass, non-alkali glass, quartz glass, low alkali glass, low expansive glass etc., a resin substrate, such as, the fluoride resin, polycarbonate (PC), polyethersulfone (PES), polyester, polymethacryl resin etc, or a metal substrate such as stainless steel, copper, nickel, low expansive alloy amber, etc. The glass substrate can be used for manufacturing a very low-cost intaglio with excellent surface smoothness among the aforementioned materials. In addition, the glass substrate is preferred because the edge of the pattern can be very sharp. Among the aforementioned glass intaglio, the non-alkali glass is one of the best materials that can meet the high accuracy specification requirement. Non-alkali glass, however, is very expensive. To meet the high accuracy specification requirement required by the ordinary PDP, the soda lime glass, for example, is sufficient.

The cavities of the intaglio can be formed by the photolithography, etching, electroforming, sand blast (shot blast), etc.

As described above, the depth of the cavity can be properly set according to the corresponding thickness of the printing pattern. However, if considering the the ink remnant within the cavity (usually the ink with half amount with respect to the depth of the cavity remains) or the thickness reduction due to the evaporation of solvent after printing, the depth is about 1~50 µm and more particularly, the preferred depth is about 3~20 µm.

Printing Blanket (Transcriber)

The printing blanket, used as a transcriber when the conductive pattern is being formed by printing, can hundred percent transcribe the ink received from the intaglio to the rear substrate. Therefore, a very thick conductive pattern can be formed and obtained by one printing.

In general, the printing blanket concerned here is formed by laminating a plurality of foundations having rubber impregnated therein, followed by forming a surface printing layer composed of rubber over the obtained supporting layer (the laminated layer) or forming a compressed layer having bubbles therein within the obtained supporting layer (the laminated layer).

There are some problems in offset printing. The solvent of the ink (the invention uses a conductive ink to be described below) permeates the surface printing layer of the printing blanket and swells due to the repeated printing. As described, the surface printing layer swells due to the solvent of the ink. The surface printing layer is saturated with the solvent of the ink, the transferring of ink transfer from the intaglio to the printing blanket thereby reduces. As a result, the thickness and the line width are uneven, causing problems like a broken pattern or a deteriorated printed shape. In addition, pinhole problem also occurs.

Therefore, according to the invention, (i) a process for transferring the conductive ink from the cavity of the intaglio to the surface of the printing blanket; and (ii) a process for transferring the conductive ink from the surface of the printing blanket to the surface of the glass substrate are performed. After the two processes are finished, a process is performed to heat the surface of the printing blanket such that the solvent of the ink is vaporized and removed from the surface printing layer.

Because the solvent permeated into the surface printing layer of the printing blanket is vaporized and removed by heating the surface of the printing blanket, i.e., the surface printing layer, the surface of the printing blanket can completely return to its original dry status.

The vaporization and the drying of the surface printing layer is easy or is not related to the heating temperature, the solvent property of the conductive ink composition or the thickness of the surface printing layer. In general, if the surface temperature $T_B$ of the printing blanket is heated up to 40~200° C., the printing blanket can be effectively dried.

When the surface temperature $T_B$ of the printing blanket is heated to a temperature lower than 40° C., the vaporization and the removal of the solvent that permeats into the surface printing layer is very ineffective. On the other hand, when the surface temperature $T_B$ of the printing blanket is heated to a temperature higher than 200° C., it causes thermal degradation and deterioration of the rubber that forms the surface printing layer. Particularly, in the above temperature range, it is better that the surface temperature $T_B$ of the printing blanket during heating is 60~150° C., and 80~120° C. is more preferable.

There are no specified limitations on the method for heating the printing blanket, for example, arranging a heating device within the blanket body to heat the whole printing blanket, blowing warm or hot blast outside of the printing blanket, arranging a heating element layer on an underlying layer of the printing blanket or heating the surface printing layer by the heating element layer located between the printing blanket and the blanket body, etc. In addition, one example of the foregoing heating element layer is a flexible sheet heater that the heating/non-heating can be operated from the outside.

The heating process for the printing blanket can also be performed regularly during the printing of the conductive pattern. Alternatively, the heating process can be regularly performed during the printing of the conductive pattern when the foregoing processes (i), (ii) are repeatedly operated for several times. Alternatively, the heating process can be irregularly performed according to the swelling degree of the printing blanket due to the solvent of the conductive ink.

There are no particular limitations on the extent of heating to the printing blanket. However, the extent of heating can be adjusted such that the surface tension of the surface layer varies between −30~30% with respect to the drying status (the initial status). By such adjustment, the printing blanket can be almost kept in its initial status as the ink solvent is being absorbed. It is possible to prevent the pattern shape from degradation and posses a superior printing accuracy for a long time.

When the surface temperature $T_B$ of the printing blanket keeps a rising status because of the foregoing heating process, the thermal expansion of the intaglio occurs as the blanket and the intaglio are in contact in the printing process, which causes a problem that the printing accuracy reduces. In general, the temperature variation of the surface temperature $T_P$ of the intaglio must be kept within ±1° C., and the variation of the surface temperature $T_B$ of the printing blanket must be converged within a certain range.

Therefore, according to the invention, the surface temperature $T_B$ of the printing blanket is set to satisfy the aforementioned equation (1) with respect to the surface temperature $T_P$ of the intaglio. Namely, the temperature difference of the surface temperature $T_B$ of the printing blanket with respect to the surface temperature $T_P$ of the intaglio is within +5° C. (not exceeding 5° C.). Preferably, the temperature difference between the surface temperature $T_B$ and the surface temperature $T_P$ is within +3° C. (not exceeding 3° C.). Because heat runs away from the printing blanket through the intaglio when the printing blanket is in contact with intaglio to receive the ink, the tolerance of the temperature variation required by the surface temperature $T_P$ is larger. If the printing process is performed (when the printing blanket is in contact with the intaglio) in a state that the surface temperature $T_B$ of the printing blanket with respect to the surface temperature $T_P$ of the intaglio exceeds 5° C., the printing accuracy is adversely affected when the variation of surface temperature $T_P$ exceeds 1° C.

There are no specified limitations on the method for cooling the surface of the printing blanket. The most effective method is to enforce cooling the surface of the printing blanket by cold blast. In general, because the blanket body is made of metal and has a large thermal capacity, an efficient cooling is possible. Also, there are other methods for cooling the surface of the printing blanket. For example, the printing blanket is in contact with a plate made of metallic material having a large thermal capacity and then rotated.

When cooling, it is better to adjust the surface temperature $T_B$ of the printing blanket to be within −5° C. (not exceeding 5° C.) with respect to the surface temperature $T_P$ of the intaglio, and preferably within −3° C. (not exceeding 3° C.). If the surface temperature $T_B$ with respect to the surface temperature $T_P$ is lower than −5° C., the printing accuracy is adversely affected when the surface temperature $T_P$ exceeds 1° C. as intaglio is in contact with the print blanket.

In regard to the printing blanket, the foundation formed the underlying layer of the surface printing layer, the rubber impregnated into the foundation, and the compressed layer formed for necessity can be made according to ordinary methods.

In addition to a sheet shape or a shape wound around a cylindrical body, the printing blanket can be a roller shape, or a curve elastic body used for the pad printing if no printing errors occur.

The requirement for the volume increasing rate of the surface layer of the printing blanket is less than 20% and preferably is less than 10% when the printing blanket is immersed in the solvent of the conductive ink at a temperature of 23° C. (room temperature) for 24 hours.

When the foregoing volume increasing rate is over 20%, the wettability variation of the surface of the printing blanket becomes large, and therefore the printing process cannot be stably performed. As will be described in greater detail below, problem, such as the line width of the pattern is being widened, may occur. In such a case, because the variation of the surface layer is too large when the conductive ink is transcribed from the printing blanket to the rear substrate, it is impossible to precisely print the pattern because of the foregoing reasons.

Additionally, the surface tension of the silicon rubber is typically 18~22 dyn/cm. However, the surface tension of the solvent varies according to the solvent types, and therefore the surface tension is substantially 30~45 dyn/cm. Accordingly, the surface tension of the silicon rubber (surface layer) increases because the solvent penetrates into the silicon rubber (surface layer) to swell the silicon rubber. Namely, the surface wittability increases such that the line width of the printed pattern is widened, and therefore the tiny dirt on the intaglio surface is transcribed, which causes a problem of a reduction of the transferability of the ink to the rear substrate.

The solvent of the conductive ink composition that penetrates into the aforementioned surface layer can be vaporized by heating the surface layer. Accordingly, the surface status changed by the penetration of the solvent can return to its original status.

The vaporizing and the extent of the drying of the solvent vary according to the thickness of the surface layer, the heating temperature and the boiling point of the solvent used. In general, the solvent can be effectively vaporized and dried by heating up to 40~200° C. The most effective method for heating and drying the surface is directly heat the printing blanket that is still mounted on the blanket body. However, the method for heating and drying is not limited to the above process. For example, the drying process can be also performed by blowing hot blast from the outside of the printing blanket. The heating and the drying processes can be regularly performed during the printing process. The heating and the drying processes can be also regularly or irregularly performed after the printing process.

It is better that the surface energy for indicating the release property of the ink on the surface layer of the printing blanket used in the invention is 15~30 dyn/cm, and is preferably 18~25 dyn/cm.

The surface layer of the printing blanket can be, for example, silicon rubber, fluoride resin, fluoride rubber or a mixture of the above. Among these materials, the printing blanket having a surface layer composed of silicon rubber is superior in the ink release property and very suitable because the ink transcribed from the intaglio can be almost hundred-percent transcribed.

The silicon rubber can be HTV (high temperature vulcanized) or RTV (room temperature vulcanized) materials etc., for example. In particular, because a RTV addition type silicone rubber does not generate by-products during vulcanization and is superior in accuracy, it is the best material for use.

Examples for silicon rubber include dimethyl silicon rubber, methylphenyl silicon rubber, trifluoropropyl methyl silicon rubber, etc.

Considering the printing accuracy, the hardness of the surface layer, formed from the silicon rubber etc., is 20~80°. The hardness of the surface layer, which is characterized by the spring type hardness (JIS-A) provided in the Japanese industrial specification K 6301 (JIS K6310), is better 20~70°, and in particular, the preferred range is 30~60°.

If the hardness of the surface layer exceeds the above range (the printing blanket is too hard), the surface layer cannot be sufficiently pressed into the cavities of the intaglio even though the printing blanket is pressed to be in contact with the intaglio. As a result, the conductive ink that is filled in the cavities cannot be sufficiently transcribed, failing to perform the high-precise printing. In contrast, if the hardness of the surface layer is lower than the above range (the printing blanket is too soft), the deformation of the surface layer is too large when the printing blanket is pressed to be in contact with the intaglio or the glass substrate, failing to perform the high-precise printing.

Considering the printing accuracy, it is preferable that the surface of the printing blanket is very smooth and its surface roughness has no influence on the printing accuracy. The ten-point mean roughness (Rz) of the surface of the printing blanket is about 0.01~3.0 μm, wherein the mean roughness (Rz) smaller than 1.0 μm is better and smaller than 0.5 μm is preferred.

The thickness of the printing blanket is not particularly limited to a certain range. However, if the thickness is over 1.5 mm, the deformation of the rubber becomes large. Therefore, it is better that the thickness does not exceed 1.5 mm to prevent the printing accuracy of the pattern from being affected.

In addition, other elastic member can be formed on the underlying layer of the surface layer such that the printing blanket is more than two layers, even though in the situation where the thickness of the surface layer has to be over at least 1 μm. If the thickness of the surface layer is lower than 1 μm, pinholes occur and the printing accuracy reduces.

The material of the elastic member formed on the underlying layer of the surface layer is not limited. However, in general, the material can be acrylonitrile-butadiene rubber (NBR), acryl rubber, fluoride rubber, chloroprene rubber, or polyvinyl chloride (PVC) etc.

In addition to a sheet shape or a shape wound around a cylindrical body, the printing blanket can be a roller shape, or a curve elastic body used for the pad printing if no printing errors occur.

Conductive Ink Composition

As described above, the conductive ink can be a paste that metal power and resin binder are dispersed or dissolved in the solvent. metal powder The metal powder that forms the conductive ink can be silver, copper, gold, nickel, aluminum, or iron etc., for example. In addition that the metal powder can be the metal selected from the exemplary metals above or a combination of two or more of the exemplary metals. Furthermore, metal plating complex (silver plating copper, for example) or alloy can be also used as the metal powder.

Among the exemplary metal powder, silver powder is the best choice if the conductivity, the cost and the oxidation resistance (oxide with a high isolation property), etc., are within consideration.

If the printability of the conductive ink is being considered, the average grain size of the metal powder can be about 0.05 μm~20 μm, and is preferably about 0.1~10 μm.

There are no specific limitations on the shape of the metal powder. However, from the point of view that resistance is lower if the contact area of the powder is larger, a squamous shape is better than a spherical shape. In order to densely pack the metal powder, it is very effective to use a mixture of the squamous metal powder and the spherical metal powder.

The packing density of the metal powder within the conductive ink can greatly suppress the volume variation when the conductive pattern is baked to form the electrode pattern. In addition, from the aspect that the ratio of the metal powder in the electrode pattern after baking is preferred to be as large as possible, if the ratio is within a range capable of sufficiently maintaining the printability of the conductive ink, the ratio of the metal powder can be higher.

There is not particular limitation on the amount of metal powder that is being added to the conductive ink. However, it is better that the weight percentage of the metal powder with respect to the amount of the conductive ink is about 60~95 w %, and 80~90 w % is preferred. If the amount of the metal powder that is added is less than the above range, the resistance of the metal pattern cannot be reduced. In contrast, if the amount of the metal powder that is being added is larger than the above range, the combining force of the resin binder that combines the metal powders is weak. Therefore the printability of the conductive ink reduces, which degrades the printing shape and reduces the transferability of the conductive ink from the printing blanket to the glass substrate, resin binder The resin binder forming the conductive ink can be hot vulcanized resin, ultraviolet vulcanized resin, hot plastic resin, or others, for example.

The hot vulcanized resin binder can be polyester melamine resin, melamine resin, epoxy melamine resin, phenol resin, polyimide resin or hot vulcanized acryl resin, for example. The ultraviolet vulcanized resin binder can be acryl resin, for example. The hot plastic resin binder can be polyester resin, polyvinyl butyral resin, cellulose resin or acryl resin, for example. The above resin materials can be used individually, or used in a combination of two or more.

Among the above resin materials, it is preferably to use a resin that can be completely decomposed into carbon dioxide ($CO_2$) and water ($H_2O$) when the resin material is baked at a high temperature exceeding 300° C.

The resin materials mentioned above can be hot plastic resin, such as polyvinyl butyral resin, cellulose resin (ethyl cellulose) or acryl resin It is better that the weight percentage of the amount of the resin binder that is added to the conductive ink with respect to the amount of the conductive ink is about 0.5~50 w %, and is preferred 1~30 w %. If the amount of the resin binder that is added is less than the above range, the combining force of the resin binder that combines the metal powders is weak. Therefore the printability (the printing shape of the pattern or the transferability of the ink from the printing blanket) of the conductive ink reduces. In contrast, if the amount of the resin binder that is added is larger than the above above, the resistance of the baked pattern cannot be reduced solvent The solvent forming the conductive ink is an important factor for controlling the printability in the intaglio offset printing, particularly, because the ink solvent is always in contact with the surface layer of the printing blanket in printing. The surface layer is swelled by the solvent and the wettability of its surface is changed. In general, if the degree of swelling due to the ink solvent is not large, the wettability of the surface of the printing blanket does not changed very much. As a result, a stable printing is possible.

Therefore, the solvent of the conductive ink can be suitably set according to the surface type of the printing blanket used for printing the conductive pattern.

According to the invention, the solvent for the conductive ink must meet the requirement that the volume increasing rate (the degree of swelling) of the surface layer of the printing blanket is less than 20% when the rubber that forms the printing blanket is immersed in the solvent of the conductive ink at the room temperature (23° C.) for 24 hours and the volume increasing rate is preferably less than 10%.

In addition to the above requirement, there are no particular limitations on the solvent for the conductive ink. However, it is better that the boiling point of the solvent is above 150° C. If the boiling point of the solvent is lower than 150° C., it is not easy to dry the glass substrate during the printing process and the printing property unavoidably changes. Additionally, it is potentially that the composition of the conductive ink easily changes with time.

The solid examples of the foregoing solvent can be in the alcohol class, such as hexanol, octanol, nonadecanol, undecanol, dodecanol, tridecanol, tetradecanol, pendadecanol, stearyl alcohol, seryl alcohol, cyclohexanol, and terpineol, etc., or can be in the alkyl ether class, such as ethylene glycol monobutyl ether (butyl cellosolve), ethylene glycol monophenyl ether, di-ethylene glycol, diethylene glycol monobutyl ether (butyl carbitol), cellosolve acetate, butyl cellosolve acetate, carbitol acetate, and butyl carbitol acetate, etc. Considering the printing suitability and workability, one, two or more among the above solvent are suitably selected.

If a high-quality alcohol is used as the solvent, butyl carbitol, butyl cellosolve, ether carbitol, butyl cellosolve acetate, and butyl carbitol acetate, etc., having a better drying ability can also be used together because the drying ability and the flowability of the ink maybe lower.

The amount of the solvent can be adjusted such that the viscosity of the conductive ink is about 50~2000 poises (P), and preferably the viscosity is adjusted to about 200~1000 P. If the viscosity of the conductive ink composition is lower or higher than the above range, the printing suitability thus reduces, which the tiny pattern may not be formed.

Therefore, the conductive ink is made by combining each of the above components, stirring them sufficiently and then mixing them.

Glass Substrate

The glass substrate having the printing pattern formed thereon by the foregoing conductive ink can be soda lime glass, non-alkali glass, quartz glass, low alkali glass or low expansive glass, for example.

In addition, if a glass substrate is provided for baking the pattern at a high temperature, it is preferably to use a glass with a high distortion point (temperature). A glass with a distortion point over 500° C. is preferred. Namely, to use a glass with a distortion point (low alkali glass) among the above glass materials is preferred.

Examples for the glass substrate can be model No. PD200, made by Asahi Glass Inc., or model No. PP8C, made by Nippon Electric Glass Inc.

The thickness of the glass substrate is not particularly limited and can be appropriately set according to the thermal stability of the glass substrate. However, the thickness is more appropriately set within the range 1~10 mm.

Conductive Pattern

The line width and the thickness of the conductive pattern printed by the conductive ink correspond to the pixel size of the PDP panel and are set with the consideration of the reduction on the line width and the thickness due to the baking process. Therefore, there are no particular limitations on these matters. However, regarding the rear substrate, the line width is generally set to 40~100 µm, and is preferably set to 50~70 µm. Moreover, the thickness is generally set to 3~30 µm, and is preferably set to 5~20 µm.

On the other hand, regarding the front substrate, the pattern of the front electrode (bus electrode) formed by the method of the invention is required to be thinner and tinnier than the pattern (the address electrode) formed on the aforementioned rear substrate. More particularly, the line width is set to 20~70 µm, and is preferably set to 30~50 µm. Moreover, the thickness is generally set to 3~30 µm, and is preferably set to 5~20 µm.

Baking of Conductive Pattern

The conductive pattern printed on the rear substrate is then baked by heating at a temperature about 450~650° C., and preferably about 500~600° C.

By the foregoing baking process, the solvent of the conductive ink is vaporized, and then the resin binder disintegrates because of thermal decomposition. Accordingly, the electrode pattern formed by that is composed of metal and corresponds to the pattern shape of the conductive pattern can be obtained.

Regarding the front substrate, the line width of the baked pattern, the electrode pattern, is set to 20~70 µm, and preferably is set to 30~50 µm. On the other hands, regarding the rear substrate, the line width of the baked pattern is set to 40~100 µm, and preferably is set to 50~70 µm.

If the line width is lower than the above range, the line is easily broken and the conductivity of the electrode pattern may get worse. On the contrary, if the line width is higher than the above range, the electrode pattern may not be suitable for the tiny pixel pattern of the PDP.

The thickness of the baked pattern, the electrode pattern, is preferably set to 3~15 µm generally. When the thickness of the pattern is below the above range, the line is easily broken and the conductivity of the electrode pattern may get worse. On the contrary, if the thickness of the pattern is higher than the above range, the electrode material wastes and therefore the material cost increase, which causes a problem reducing the surface smoothness of the electrode pattern.

<<Embodiment 1>>

A conductive ink containing silver powder is printed by the intaglio printing to obtain a conductive pattern, and the conductive pattern is then baked to form a rear electrode pattern on the rear substrate of the plasma display panel (PDP).

The pattern formed by the printing process is designed to have a line width of 80 µm and a film thickness (non-baked) of 10 µm. A glass-made intaglio is used and the printing blanket has a surface layer (thickness: 300 µm) made of silicon rubber (RTV-addition type di-methyl silicon rubber, "KE1600" made by Shin Etsu Chemical Inc.) with a rubber hardness of 40 and a ten-point mean roughness of 0.1 µm.

Regarding the conductive ink, ether cellulose resin (as the resin binder) 100 parts by weight, flake silver powder (as the metal powder, 5 µm in average diameter) 800 parts by weight, and glass frit (5 µm in average diameter) 20 parts by weight are added to butyl carbitol acetic acid (BCA) 50 parts by weight, and then mixed and dispersed by three rolls.

When the printing of the conductive pattern is performed using the above materials, the ink being transferred to the printing blanket can be completely transferred to the glass substrate, and therefore a conductive pattern having an excellent shape and a stable thickness can be formed. In addition, the repeated printability is also very superior.

The obtained conductive pattern is then baked for one hour at a temperature of 550° C. to completely decompose the resin, and therefore a silver electrode is formed.

Comparing with the conductive pattern, the shape of the baked electrode pattern is substantially unchanged. As a result, the line width, film thickness or electric resistance can be stable. The film thickness of the electrode pattern is 5 µm. In addition, the accuracy of the electrode pattern is very excellent and can be kept within a range of ±10 µm on a 42-inch surface. The packaging of the PDP panel is thus not a problem.

Because the degree of swelling of the printing blanket used in embodiment 1 with respect to the solvent of the conductive ink is small, even though the printing process is repeatedly performed, the change in the printing quality and the line width of the pattern can be suppressed to a small range. If the line width of the pattern at an early printing stage is 100 µm, the line width after repeatedly printed over 10000 times becomes 110 μm. From the point of view of the accuracy required by the PDP, the increasing rate of the line width is very low.

According to the embodiment 1 of the invention, the amount of the electrode material used can be minimized, and liquid waste, etc. will not be generated. Because the printing equipment required for forming the electrode pattern is inexpensive, the manufacturing cost of the rear electrode for the PDP panel can be low.

<<Embodiment 2>>

The formation of the conductive ink is under the same conditions as in embodiment 1 except that the solvent of the conductive ink BCA is replaced by butyl carbitol (BC). Then, the conductive pattern and the electrode pattern are formed.

When the foregoing silicon rubber used as the surface layer of the printing blanket is immersed in the solvent (BC) for 24 hours at the room temperature (23° C.), the volume increasing rate (the degree of swelling) of the silicon rubber is 5%.

The printing process of embodiment 2 uses the above conductive ink and the other materials are same as embodiment 1. Because the degree of swelling of the printing blanket is smaller than that in embodiment 1, the change of the printing quality and the line width of the pattern can be suppressed to a small range even though the printing process is repeatedly performed. If the line width of the pattern at the early printing stage is 100 μm, the line width becomes 105 μm after being repeatedly printed over 10000 times.

Comparing with the conductive pattern, the shape of the electrode pattern obtained in embodiment 2 is substantially unchanged. Similar to embodiment 1, the line width, film thickness or the electric resistance can be stable. The film thickness of the electrode pattern is 5 μm. In addition, the accuracy of the electrode pattern is very excellent and can be kept within a range of ±10 μm on a 42-inch surface. According to the embodiment 2 of the invention, the amount of the electrode material used can be minimized, and liquid waste, etc. will not generated. Because the printing equipment is inexpensive, the manufacturing cost of the rear electrode for the PDP panel can be low.

<<Embodiment 3>>

The forming of the conductive ink is under the same conditions as in embodiment 1, except that the resin binder of the conductive ink cellulose resin is replaced by acryl resin. Then, the conductive pattern and the electrode pattern are formed.

When the foregoing silicon rubber used as the surface layer of the printing blanket is immersed in the solvent (BC) for 24 hours at the room temperature (23° C.), the volume increasing rate (the degree of swelling) of the silicon rubber is 5%.

In embodiment 3, because the degree of swelling of the printing blanket with respect to the solvent of the conductive ink is smaller, the change of the printing quality and the line width of the pattern are minimized even though the printing process is repeatedly performed. If the line width of the pattern at the early printing stage is 100 μm, the line width after repeatedly printed over 10000 times becomes 110 μm. From the point of view of accuracy required by the PDP, the increasing rate of the line width is very low.

The shape of the electrode pattern obtained in embodiment 3 is substantially unchanged. Similar to embodiment 1, the line width, film thickness or electric resistance can be stable. The film thickness of the electrode pattern is 5 μm. In addition, the accuracy of the electrode pattern is excellent and can be kept within a range of ±10 μm on a 42-inch surface. According to the embodiment 3 of the invention, the amount of the electrode material used can be minimized, and liquid waste etc. will not be generated. Because the printing equipment is inexpensive, the manufacturing cost of the rear electrode for the PDP panel can be low.

COMPARISON EXAMPLE 1

The forming of the conductive ink is under the same conditions as in embodiment 1 except that the solvent of the conductive ink BCA is replaced by terpineol. Then, the conductive pattern and the electrode pattern are formed.

When the foregoing silicon rubber used as the surface layer of the printing blanket is immersed in the solvent (terpineol) for 24 hours at the room temperature (23° C.), the volume increasing rate (the degree of swelling) of the silicon rubber is 25%.

Because the solvent used in comparison example 1 causes the printing blanket to swell to a large extemt, if the printing process is repeatedly performed, the printing quality apparently reduces, especially in the increment of the pattern line width. If the line width of the pattern at the early printing stage is 100 μm, the line width after a repeated printing of over 1000 times becomes 125 μm. As a result, the accuracy of the pattern required by the PDP panel is not sufficient and the printing durability of the printing blanket is also insufficient.

COMPARISON EXAMPLE 2

A photosensitive silver paste ("fodel"® of Dupont) is uniformly coated up to 10 μm on the whole rear substrate (42 inches in diagonal) of the plasma display panel (PDP) by means of the screen printing process.

Next, the electrode pattern on the stripe is formed by exposure and development, and then a silver electrode is formed by baking for one hour at 550° C.

Similar to embodiment 1, a trial electrode pattern is made having a line width of 80 μm and a line pitch of 360 μm.

The property of the electrode is substantially the same as that in embodiment 1 and is good. However, a large amount of liquid waste are generated when the silver electrode is developed. Furthermore, because the photolithographic process (exposure, development and drying) is performed, the successful cost is about 5~10 times of that in embodiment 1.

COMPARISON EXAMPLE 3

The same conductive ink in embodiment 1 is used to form a conductive pattern having a line width of 80 μm and a line pitch of 360 μm on the rear substrate (42 inches in diagonal) of the PDP by the screen printing.

Similar to embodiment 1, the liquid waste will not be generated and the cost required for forming the pattern by printing is very low. However, the printing accuracy is very low and cannot be kept within a range of ±50 μm on the 42-inch panel surface. Therefore, the accuracy is insufficient for practice.

According to the embodiments described above, the manufacturing method for the electrode substrate of the PDP provides tiny and highly precise pattern required by the rear and front electrodes of the PDP panel, and can be made in a low price.

In addition, the rear electrode obtained according to the invention and the front electrode made by the same method are very suitable for the highly precise PDP panel.

<<Embodiment 4>>

As shown in FIG. 1, a conductive ink containing silver powder is printed by the intaglio printing to obtain a conductive pattern, and the conductive pattern is then baked to form a rear electrode pattern 14 on the rear substrate 11 (glass substrate of 42 inches in diagonal) of the plasma display panel (PDP). Followings are a detailed description.

Figure 2:
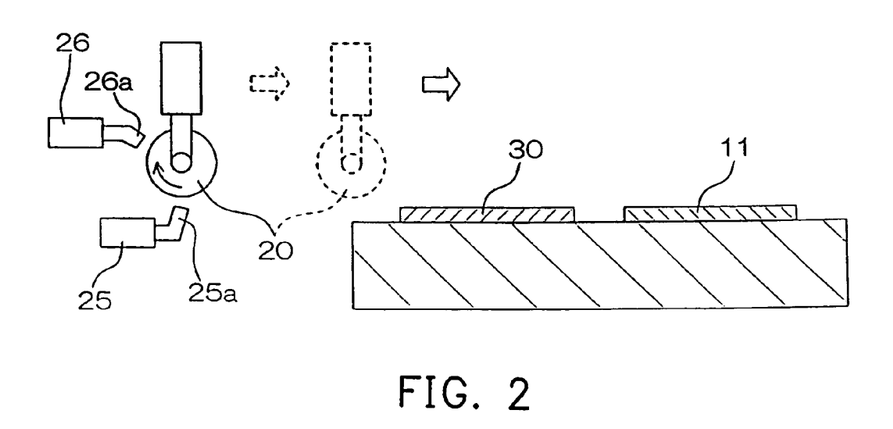
FIG. 2 shows a diagram illustrating the method for manufacturing a printing process of a conductive pattern according to the embodiments of the present invention.

As shown in FIG. 2, the intaglio 30 used for forming the conductive pattern is made of glass. The pattern formed by the printing process is designed to have a line width of 80 µm, a line pitch of 360 µm and a film thickness (non-baked) of 10 µm. And the intaglio offset printing machine of a platform type is used.

The printing blanket 20 has a surface layer made of silicon rubber (RTV-addition type di-methyl silicon rubber, "KE1600" made by Shin Etsu Chemical Inc.) with a thickness of 300 µm, a rubber hardness of 40 and a ten-point mean roughness of 0.1 µm.

Regarding the conductive ink, ether cellulose resin (as the resin binder) 100 parts by weight, flake silver powder (as the metal powder, 5 µm in average diameter) 800 parts by weight, and glass frit (5 µm in average diameter) 20 parts by weight are added to butyl carbitol acetic acid (BCA) 50 parts by weight, and the n mixed and dispersed by three rolls. In addition, to adjust the final viscosity, BCA can be added appropriately.

The printing of the conductive pattern is performed by the intaglio offset printing using the above materials. When the printing for ten pieces of the glass substrate (rear substrate) 11 is finished, a heating process is performed to the printing blanket 20 by blowing the printing blanket 20 with a hot blast from a ventilator 25a of a heating device 25. The heating process is adjusted such that the surface temperature $T_B$ of the printing blanket 20 is 80° C., and is performed for 5 minutes. In addition, the room temperature in the clean room the printing machine is installed is adjusted to 23±1° C. and the surface temperature $T_P$ of the intaglio is also 23±1° C.

After the heating process, the printing blanket 20 is blown with a cold blast from a ventilator 26a of a cooling device 26. A cooling process is performed such that the surface temperature $T_B$ of the printing blanket 20 with respect to the surface temperature $T_P$ of the intaglio is within +3° C. During the cooling process, it should be noted that the surface temperature $T_B$ of the printing blanket 20 with respect to the surface temperature $T_P$ of the intaglio can not exceed 3° C.

After the cooling process, the printing of the conductive pattern is performed again. The ink transferred from the intaglio 30 to the printing blanket 20 can be completely transferred to the glass substrate 11. To confirm whether the ink is completely transferred and whether any ink is remaining can be visually determined by the reflecting light from the surface because the surface of the printing blanket is white and brilliant.

In addition, as described above, the conductive pattern formed on the glass substrate 11 has an excellent shape and its film thickness is also stable. As shown in Table 1 below, the repeated printability is also superior. Even though the printing is repeatedly performed, the variation of the printing quantity and the line width of the pattern can be controlled within a smallest range.

Regarding the variation of the line width of the pattern, it is evaluated by measuring the line width of the pattern (line) and then calculating the difference ΔW between the maximum width $W_{max}$ and the minimum width $W_{min}$ according to the following equation (2).

$$\Delta W = W_{max} - W_{min} \qquad (2)$$

Table 1 shows a measuring result of ΔW after 10, 500, 1000, and 3000 pieces are printed in the situation in embodiment 1 and a reference situation of heating and cooling processes are performed to the printing blanket.

TABLE 1

| printing pieces | 10 pieces | 500 pieces | 1000 pieces | 3000 pieces |
|---|---|---|---|---|
| embodiment 1 | 2 µm | 3 µm | 3 µm | 3 µm |
| reference | 3 µm | 10 µm | 20 µm | 30 µm |

As shown in Table 1, in embodiment 4, after the conductive pattern is printed on the glass substrate for 3000 pieces, ΔW of the reference situation becomes very large with respect to that of embodiment 1, wherein ΔW is a small value of 3 µm.

According to the foregoing printing method, by baking the conductive pattern formed on the glass substrate 11 for 1 hour at 550° C. to completely decompose the resin, the silver electrode pattern with a thickness of 5 µm is formed.

In comparison with the conductive pattern, the shape of the baked electrode pattern is substantially unchanged. As a result, the line width, the film thickness or the electric resistance can be stable. The film thickness of the electrode pattern is 5 µm. In addition, the accuracy of the electrode pattern is very excellent and can be kept within a range of ±10 µm on a 42-inch surface. The packaging the PDP panel has absolutely no problem.

As described above, according to the manufacturing method for the electrode substrate of the PDP shown in the embodiment 4 of the invention, the amount of the electrode material used can be minimized, and liquid waste, etc. will not be generated. Because the printing equipment required for forming the electrode pattern is inexpensive, the manufacturing cost of the rear electrode for the PDP panel can be low. Furthermore, a very high quality electrode substrate for the PDP panel can be made.

<<Embodiment 5>>

The conductive pattern is printed by the intaglio offset printing method using the same materials used in embodiment 4. When the printing of 5 pieces of the glass substrates is finished, the heating and cooling processes are performed to the printing blanket. A described above, the heating and cooling processes are performed on every 5 printing (every 10 printing in embodiment 4).

The heating process to the printing blanket is adjusted such that the surface temperature $T_B$ of the printing blanket 20 is 80° C., and is performed for 2 minutes. In addition, the cooling process is performed such that the surface temperature $T_B$ of the printing blanket 20 with respect to the surface temperature $T_P$ of the intaglio is within +2° C. (not exceeding 2° C. with respect to the surface temperature $T_P$ of the intaglio).

As a result, because the degree of the swelling of the printing blanket is smaller than that in embodiment 4, even though the printing process is repeatedly performed, the change of the printing quality and the line width of the pattern can be further minimized.

In addition, when the conductive pattern formed on the glass substrate by the above printing method is baked under the same condition in embodiment 4 to form the silver electrode pattern with a thickness of 5 µm, the shape of the electrode pattern is substantially unchanged except the film thickness in comparison with that of the conductive pattern.

Similar to embodiment 4, the line width of the pattern, the film thickness or the electric resistance can be stable. In addition, the accuracy of the electrode pattern is excellent and can be kept within a range of ±80 μm on a 42-inch panel surface.

As described above, according to the method for manufacturing the electrode substrate of the PDP panel, the effect can be equal to or higher than that of embodiment 4.

COMPARISON EXAMPLE 4

A photosensitive silver paste ("fodel"® of Dupont) is uniformly coated up to 10 μm on the whole rear substrate (42 inches in diagonal) of the plasma display panel (PDP) by means of the screen printing process.

Next, the electrode pattern on the stripe is formed by exposure and development, and then a silver electrode is formed by baking for one hour at 550° C. Similar to embodiment 4, a trial electrode pattern of the PDP panel is made to have a line width of 80 μm and a line pitch of 360 μm.

As a result, the property of the electrode is substantially the same as that in embodiment 4 and is good. However, a large amount of liquid waste is generated when the silver electrode is developed. Furthermore, because the photolithographic process (exposure, development and drying) is performed, the cost for successful printing is about 5~10 times in comparison with that of embodiment 4.

COMPARISON EXAMPLE 5

The same conductive ink in embodiment 4 is used to form a conductive pattern having a line width of 80 μm and a line pitch of 360 μm on the rear substrate (42 inches in diagonal) of the PDP by the screen printing.

As a result, similar to embodiment 4, the liquid waste will not be generated and the cost required for forming the pattern by printing is very low. However, the printing accuracy is very low and cannot be kept within a range of ±70 μm on the 42-inch panel surface. Therefore, the printing accuracy is insufficient for practice.

While the present invention has been described with a preferred embodiment, this description is not intended to limit our invention. Various modifications of the embodiment will be apparent to those skilled in the art. It is therefore contemplated that the appended claims will cover any such modifications or embodiments as fall within the true scope of the invention.

What is claimed is:

1. A method for manufacturing an electrode substrate of a plasma display panel, comprising steps of:
    filling a conductive ink into cavities of an intaglio, wherein the conductive ink is formed by dispersing or dissolving a metal powder and a resin binder into a solvent;
    transferring the conductive ink from the cavities of the intaglio onto a printing blanket, wherein the printing blanket has a rubber layer as a surface layer of the printing blanket, and the rubber layer poses a volume increasing rate under 20% when the rubber is immersed in the solvent of the conductive ink for 24 hours at 23° C.;
    transcribing the conductive ink from the surface layer of the printing blanket onto a glass substrate; and
    baking a conductive pattern composed of the conductive ink composition formed on the surface of the glass substrate to remove a resin binder component of the conductive pattern.

2. The method of claim 1, wherein the rubber layer is composed of a silicon rubber with a hardness (JIS A) of 20~80° and a ten-point mean roughness (Rz) of 0.01~3.0 μm.

3. The method substrate of claim 2, wherein the rubber layer is composed of the silicon rubber with a hardness (JIS A) of 20~70° and a ten-point mean roughness (Rz) of less than 1 μm.

4. A method for manufacturing an electrode substrate of a plasma display panel, comprising steps of:
    filling a conductive ink into cavities of an intaglio, wherein the conductive ink is formed by dispersing or dissolving a metal powder and a resin binder into a solvent;
    performing following processes (i) and (ii) in a sequence;
        (i) transferring the conductive ink from the cavities of the intaglio to a surface of a printing blanket;
        (ii) transferring the conductive ink from the surface of the printing blanket to a surface of a glass substrate; and
    baking a conductive pattern composed of the conductive ink formed on the surface of the glass substrate to remove a resin binder component of the conductive pattern;
    wherein after the processes (i) and (ii) are performed in the sequence for one, two or more times, the printing blanket is heated such that a surface temperature $T_B$ of the printing blanket is about 40~200° C., and then the printing blanket is cooled in a condition that the surface temperature $T_B$ (° C.) of the printing blanket with respect to a surface temperature $T_P$ (° C.) of the intaglio satisfies a following equation:

$$|T_P - T_B| \leq 5° C.$$

5. The method of claim 4, wherein the rubber layer is composed of a silicon rubber with a hardness (JIS A) of 20~80°, a ten-point mean roughness (Rz) of 0.01~3.0 μm, and a thickness of 1~1500 μm.

* * * * *